(12) United States Patent
Ha et al.

(10) Patent No.: US 6,429,140 B1
(45) Date of Patent: Aug. 6, 2002

(54) METHOD OF ETCHING OF PHOTORESIST LAYER

(75) Inventors: Jae Hee Ha; Dong Hyen Yi, both of Chungcheongbuk-do; Myung Ho Yim, Kyungki-do, all of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 725 days.

(21) Appl. No.: 08/810,920

(22) Filed: Mar. 5, 1997

(30) Foreign Application Priority Data

Oct. 24, 1996 (JP) .......................... 1996-48002

(51) Int. Cl.[7] .......................................... H01L 21/3065
(52) U.S. Cl. ...................... 438/717; 438/732; 438/733; 438/736; 438/738
(58) Field of Search ................ 438/733, 736, 438/738

(56) References Cited

U.S. PATENT DOCUMENTS

| | | | |
|---|---|---|---|
| 4,473,437 A | * | 9/1984 | Higashikawa et al. ...... 156/643 |
| 5,266,157 A | * | 11/1993 | Kadomura ............... 156/659.1 |
| 5,312,717 A | * | 5/1994 | Sachdev et al. ............ 430/313 |
| 5,508,144 A | * | 4/1996 | Katz et al. ................. 430/296 |
| 5,632,910 A | * | 5/1997 | Nagayama et al. ........... 216/47 |

FOREIGN PATENT DOCUMENTS

| | | | |
|---|---|---|---|
| JP | 58-87824 A2 | * | 5/1983 |
| JP | 01-206624 A | * | 8/1989 |

OTHER PUBLICATIONS

Hara, T. et al "Damage formed by electron cyclotron resonance plasma etching on a gallium arsenide surface" J. Appl. Phys. vol.67 (6) 2836–2839, Mar. 1990.*

* cited by examiner

*Primary Examiner*—Anita Alanko
(74) *Attorney, Agent, or Firm*—Fleshner & Kim, LLP

(57) ABSTRACT

A method of forming a patterned photoresist layer is performed in a nitrogen gas atmosphere. The method includes the steps of sequentially forming a layer to be etched and first photoresist layer on a semiconductor substrate, and sequentially forming an intermediate barrier layer and second photoresist layer on the first photoresist layer. The second photoresist layer is patterned, and the intermediate barrier layer is etched using the patterned second photoresist layer as a mask. The first photoresist layer is etched in a nitrogen gas atmosphere, and the first photoresist layer is etched using the patterned intermediate barrier layer as a mask.

18 Claims, 2 Drawing Sheets

METHOD OF ETCHING OF PHOTORESIST LAYER

BACKGROUND OF THE INVENTION

1. Field of the Invention

The present invention relates to a method of etching a multilevel photoresist layer and, more particularly, to a method of etching a multilevel photoresist layer.

2. Background of the Related Art

To form a semiconductor device, a multilevel photoresist layer is generally used to form a fine pattern if its step coverage is poor. A lower planarizing photoresist layer of the multilevel photoresist layer is generally very thick. Accordingly, its step coverage should be adequate to easily perform the exposure process. The lower planarizing photoresist layer is etched using an intermediate barrier layer of the multilevel photoresist layer as a mask under the condition of higher etch selectivity such that there is no loss of vertical profile and critical dimension (CD).

FIGS. 1A to 1C are cross-sectional views showing a method of etching a photoresist layer in the related art. As shown in FIG. 1A, a layer 12 to be etched is formed on a semiconductor substrate 11, and a first photoresist layer 13 for planarization is formed thereon. An intermediate barrier layer 14 is formed on first photoresist layer 13, and a second photoresist layer 15 is formed thereon.

As shown in FIG. 1B, a second photoresist layer 15 is patterned, and then an intermediate barrier layer 14 is etched using second photoresist layer pattern 15 as a mask. The intermediate barrier layer 14 is etched using fluorine plasma, resulting in a profile as shown in FIG. 1B.

As shown in FIG. 1C, a first photoresist layer 13 is etched using intermediate barrier layer 14, which has been etched, as a mask. The first photoresist layer 13 is dry-etched using an oxygen based process having a higher etch rate to the photoresist layer. However, if only oxygen gas is used for etching first photoresist layer 13, the photoresist layer has isotropic profile due to spontaneous chemical reaction ($C+O\rightarrow CO_2$) between the oxygen gas and photoresist, resulting in severe side etching of the photoresist layer.

To prevent such a problem, a gas such as Ar, Co, $SO_2$, $N_2O$ $C_5H_8$ (for sidewall passivation of the first photoresist layer) is added to the oxygen plasma when first photoresist layer 13 is etched. Otherwise, the first photoresist layer is etched at a low temperature of below $-40°$ C., to thereby induce the sidewall passivation. Thereafter, as shown in FIG. 1D, intermediate barrier layer 14 is removed, and layer 12 is selectively etched using first photoresist layer pattern 13 as a mask.

The above-described conventional method of etching a photoresist layer has various problems. If Ar, Co, $SO_2$, $N_2O$ or $C_5H_8$ is added to the oxygen plasma for the purpose of inducing the sidewall passivation and vertical profile of the photoresist layer, the intermediate barrier layer is eroded, resulting in a decrease of the etch selectivity of the photoresist layer to the intermediate barrier layer. Further, the etching apparatus must be changed.

SUMMARY OF THE INVENTION

An object of the present invention is to substantially obviate one or more of the problems due to limitations and disadvantages of the related art.

Another object of the present invention is to improve the side wall passivation.

Another object of the present invention is to improve the vertical profile results.

Such objects, features and advantages may be achieved at least in part or whole by a method of etching a photoresist layer, in which a photoresist layer is etched using nitrogen gas at a substantially room temperature instead of oxygen gas.

The present invention may be achieved in part or in whole by a method of forming a patterned photoresist layer used for etching a layer on a substrate, comprising the steps of forming a first photoresist layer on the layer; forming a barrier layer on the photoresist layer; patterning the barrier layer; and patterning the first photoresist layer in a nitrogen gas atmosphere using the patterned barrier layer as a mask.

To achieve these and other advantages and in accordance with the purpose of the present invention, the method of etching a photoresist layer includes the steps of sequentially forming a layer to be etched and first photoresist layer on a semiconductor substrate; sequentially forming an intermediate barrier layer and second photoresist layer on the first photoresist layer; patterning the second photoresist layer, and etching the intermediate barrier layer using the patterned photoresist layer as a mask; and etching the first photoresist layer in a nitrogen gas atmosphere, using the intermediate barrier layer patterned as a mask.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
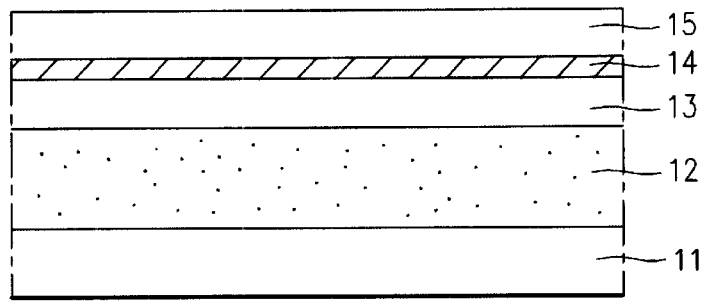
FIGS. 1A to 1D are cross-sectional views showing a method of etching a photoresist layer in accordance with the related art.
Figure 1B:
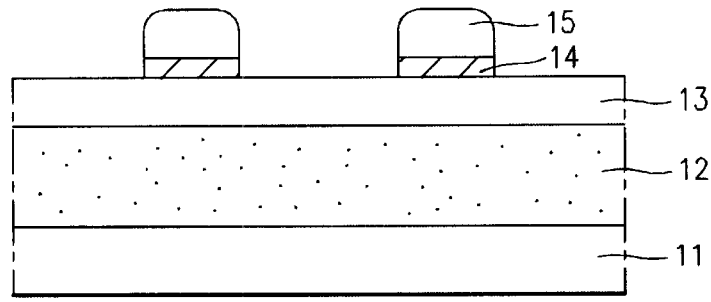
Figure 1C:
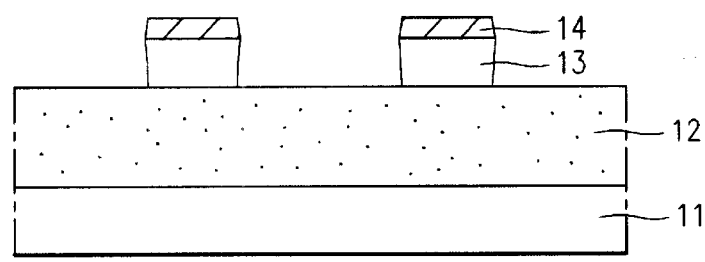
Figure 1D:
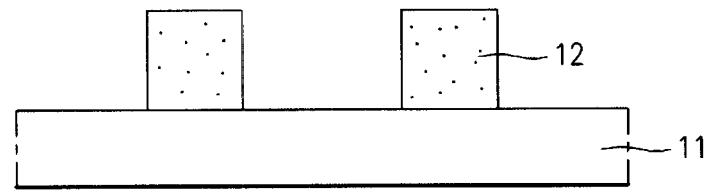
Figure 2A:
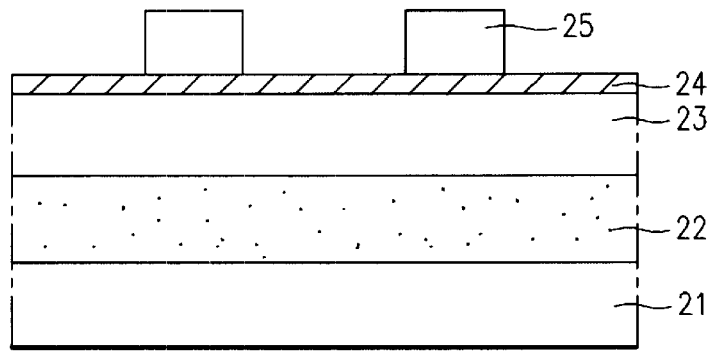
FIGS. 2A to 2D are cross-sectional views showing a method of etching a photoresist layer according to the present invention.

FIGS. 2A to 2D are cross-sectional views showing a method of etching a photoresist layer according to the present invention. As shown in FIG. 2A, a layer 22 (to be etched) is formed on a semiconductor substrate 21, and a first photoresist layer 23 for planarization and intermediate barrier layer 24 are sequentially formed on layer 22. The barrier layer 24 is an oxide layer or nitride layer. After forming a second photoresist layer 25 on intermediate barrier layer 24, second photoresist layer 25 is patterned.

Figure 2B:
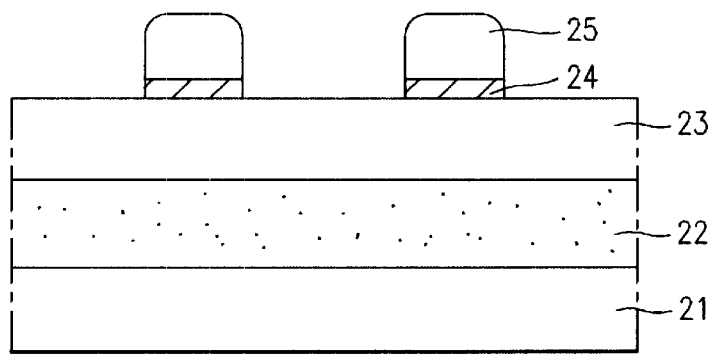
Figure 2C:
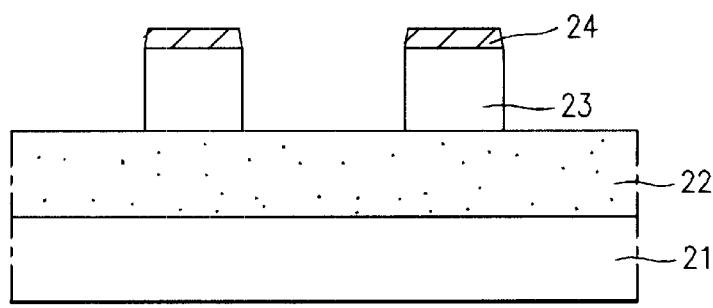

The intermediate barrier layer 24 is etched using second photoresist layer pattern 25 as a mask (see FIG. 2B). The intermediate barrier layer is etched using fluorine plasma. The second photoresist layer 25 is removed, and first photoresist layer 23 is etched using intermediate barrier layer 24 etched as a mask (see FIG. 2C).

Figure 2D:
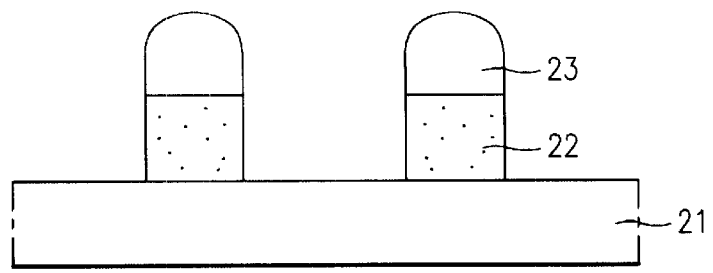

As shown in FIG. 2D, intermediate barrier layer 24 is removed, and layer 22 is etched using first photoresist layer 23 as a mask, accomplishing the etching process of the photoresist layer according to the present invention.

The first photoresist layer 23 is etched using only nitrogen gas in a high-density etching apparatus, such as a helicon-type etching apparatus. Nitrogen gas is light and improves the sidewall passivation during the etching of first photoresist layer 23 at a normal temperature. Accordingly, it does not require the temperature of the substrate to be lower. It is preferable that the flow rate of nitrogen gas is preferably about 80 to 100 sccm. The temperature range of the semiconductor substrate is preferably about 0 to 25° C. A source power and a bias power are preferably about 2000 to 2800W, and 200 to 300W, respectively, when first photoresist layer 23 is etched. With such conditions, the etch rate of the first photoresist layer is about 3500 to 4500 Å/min.

The method of etching a photoresist layer of the present invention has various advantages. The apparatus for etching does not need to be changed, because there is no need for the temperature of the substrate to be lower (e.g., −40° C.). Further, a separate gas for the sidewall passivation is not needed. Since nitrogen gas is used, the etch selectivity of the photoresist layer 23 to the intermediate barrier layer 24 is higher. Moreover, the erosion of the intermediate barrier layer is prevented. Such a method improves critical dimension, and an improved vertical profile of the photoresist layer can be obtained. Accordingly, layer 22 placed under the first photoresist layer 23 can be easily etched.

It is to be understood that both the foregoing general description and the following detailed description are exemplary and explanatory. It will be apparent to those skilled in the art that various modifications and variations can be made in the method of etching a photoresist layer of the present invention without departing from the spirit or scope of the invention. It is intended that the present invention cover the modifications and variations of this invention which are within the scope of the appended claims and their equivalents.

What is claimed is:

1. A method of etching a photoresist layer, comprising the steps of:
   sequentially forming a layer to be etched and first photoresist layer on a semiconductor substrate;
   sequentially forming an intermediate barrier layer and second photoresist layer on the first photoresist layer;
   patterning the second photoresist layer, and etching the intermediate barrier layer using the second photoresist layer patterned as a mask; and
   etching the first photoresist layer with a helicon-type etching apparatus, using only nitrogen gas, using the patterned intermediate barrier layer as a mask.

2. The method of claim 1, wherein the intermediate barrier layer is one of an oxide layer and nitride layer.

3. The method of claim 1, wherein the intermediate barrier layer is etched using fluorine gas in a plasma etching apparatus.

4. The method of claim 1, wherein the flow rate of the nitrogen gas is about 80 to 100 sccm during the etching of the first photoresist layer.

5. The method of claim 1, wherein the temperature range of the semiconductor substrate is 0 to 25° C. during the etching of the first photoresist layer.

6. The method of claim 1, wherein the etch rate of the first photoresist layer is about 3500 to 4500 Å/min.

7. The method of claim 1, wherein a source power and a bias power are about 2000 to 2800W, and about 200 to 300W, respectively.

8. The method of claim 1, further comprising the step of patterning the layer to be etched using the first photoresist layer as a mask.

9. The method of claim 8, further comprising the step of removing the intermediate barrier layer placed on the first photoresist layer before the step of patterning the layer to be etched.

10. A method of forming a patterned photoresist layer used for etching a layer on a substrate, comprising the steps of:
    forming a first photoresist layer on the layer;
    forming a barrier layer on the photoresist layer;
    patterning the barrier layer; and
    patterning the first photoresist layer by reactive ion etching in a nitrogen gas atmosphere using the patterned barrier layer as a mask, wherein the source power is approximately 2000W–2800W, and wherein the bias power is approximately 200W–300W.

11. The method of claim 10, wherein the step of patterning the barrier layer comprises the steps of:
    forming a second photoresist layer on the barrier layer;
    patterning the second photoresist layer; and
    etching the barrier layer using the second photoresist layer as a mask.

12. The method of claim 10, wherein the barrier layer is patterned using a plasma etching apparatus.

13. The method of claim 10, wherein the first photoresist layer is patterned at a substantially room temperature.

14. The method of claim 13, wherein the first photoresist layer is patterned at a temperature of about 0 to 25 degree Celsius.

15. The method of claim 10, wherein the step of patterning the first photoresist layer comprises the step of etching the first photoresist layer using the patterned barrier layer as a mask.

16. The method of claim 15, wherein the first photoresist layer is etched at an etch rate of about 3500 to 4500 Å/minute.

17. The method of claim 10, wherein a flow of nitrogen is about 80 to 100 sccm.

18. The method of claim 10, wherein the first photoresist layer is patterned using a helicon-type etching apparatus.

* * * * *